United States Patent
Yamada et al.

(10) Patent No.: US 9,735,003 B2
(45) Date of Patent: Aug. 15, 2017

(54) FILM-FORMING APPARATUS AND FILM-FORMING METHOD

(71) Applicant: NuFlare Technology, Inc, Numazu-shi, Shizuoka (JP)

(72) Inventors: Takumi Yamada, Shizuoka (JP); Yuusuke Sato, Tokyo (JP)

(73) Assignee: NuFlare Technology, Inc, Yokohama-shi (JP)

( * ) Notice: Subject to any disclaimer, the term of this patent is extended or adjusted under 35 U.S.C. 154(b) by 748 days.

(21) Appl. No.: 13/850,524

(22) Filed: Mar. 26, 2013

(65) Prior Publication Data
US 2013/0255569 A1    Oct. 3, 2013

(30) Foreign Application Priority Data

Mar. 29, 2012 (JP) .................................. 2012-076781

(51) Int. Cl.
*C23C 16/458* (2006.01)
*H01L 21/02* (2006.01)
(Continued)

(52) U.S. Cl.
CPC .... *H01L 21/02104* (2013.01); *C23C 16/4585* (2013.01); *C30B 25/10* (2013.01); *C30B 25/12* (2013.01); *C30B 25/14* (2013.01)

(58) Field of Classification Search
CPC ..... C23C 16/4585; C30B 25/10; C30B 25/12; C30B 25/14; H01L 21/02104
See application file for complete search history.

(56) References Cited

U.S. PATENT DOCUMENTS

2008/0032036 A1*  2/2008  Ito ........................... C23C 16/46
                                                                                427/8
2009/0139448 A1*  6/2009  Hirata ................. C23C 16/4584
                                                                                117/107
(Continued)

FOREIGN PATENT DOCUMENTS

JP      05-152207      6/1993
JP      11-168066      6/1999
(Continued)

OTHER PUBLICATIONS

Korean Office Action for Korean Patent Application No. 2013-29231 issued Feb. 17, 2014.
(Continued)

*Primary Examiner* — Matthew Song
(74) *Attorney, Agent, or Firm* — Amin, Turocy & Watson LLP

(57) ABSTRACT

A film-forming apparatus and film-forming method comprising, a chamber, a first gas supply unit supplying a reaction gas for a film-forming process to the chamber, a substrate-supporting portion supporting a substrate placed in the chamber, a heating unit heating the substrate from below the substrate-supporting portion, a rotary drum supporting the substrate-supporting portion on a top thereof, and including the heating unit disposed therein, a rotary shaft disposed in a lower part of the chamber, and rotating the rotary drum, a reflector reflecting heat from the heating unit, surrounding the rotary drum, and being disposed so as to have an upper end higher in height than an upper end of the substrate-supporting portion, and a second gas supply unit supplying a hydrogen gas or an inert gas between the rotary drum and the reflector.

11 Claims, 9 Drawing Sheets

(51) Int. Cl.
*C30B 25/10* (2006.01)
*C30B 25/12* (2006.01)
*C30B 25/14* (2006.01)

(56) References Cited

U.S. PATENT DOCUMENTS

| | | | | |
|---|---|---|---|---|
| 2009/0239362 A1* | 9/2009 | Hirata | ............... | C23C 16/45591 |
| | | | | 438/509 |
| 2011/0114013 A1* | 5/2011 | Suzuki | ................ | C23C 16/4401 |
| | | | | 117/84 |
| 2011/0265710 A1* | 11/2011 | Suzuki | .............. | C23C 16/45519 |
| | | | | 117/85 |
| 2011/0312187 A1 | 12/2011 | Suzuki et al. | | |
| 2012/0048180 A1* | 3/2012 | Ito | ......................... | C23C 16/325 |
| | | | | 117/88 |

FOREIGN PATENT DOCUMENTS

| | | |
|---|---|---|
| JP | 2000-216103 | 8/2000 |
| JP | 2011-091389 | 5/2011 |
| KR | 20090101830 | 9/2009 |
| KR | 20110139097 | 12/2011 |

OTHER PUBLICATIONS

Office Action of Notification of Reasons for Refusal for Japanese Patent Application No. 2012-076781 dated May 12, 2015, 5 pages.

\* cited by examiner

FILM-FORMING APPARATUS AND FILM-FORMING METHOD

CROSS-REFERENCE TO THE RELATED APPLICATION

The entire disclosure of the Japanese Patent Applications No. 2012-076781, filed on Mar. 29, 2012 including specification, claims, drawings, and summary, on which the Convention priority of the present application is based, are incorporated herein in its entirety.

FIELD OF THE INVENTION

The present invention relates to a film-forming apparatus and a film-forming method.

BACKGROUND ART

Epitaxial growth technique for depositing a monocrystalline film on a substrate such as a wafer is conventionally used to produce a semiconductor device such as a power device (e.g., IGBT (Insulated Gate Bipolar Transistor)) requiring a relatively thick crystalline film.

In order to produce a thick epitaxial film in high yield, a fresh source gas needs to be continuously brought into contact with the surface of a wafer while the wafer is rotated and uniformly heated. Therefore, in the case of a conventional film-forming apparatus, a film is epitaxially grown at a high speed (see, for example, Japanese Patent Application Laid-Open No. H05-152207).

In Japanese Patent Application Laid-Open Publication No. 05-152207, a ring-like susceptor supporting a wafer is fitted to a susceptor support, and the wafer is rotated according to rotation of a rotary shaft connected to the susceptor support. The susceptor has a structure that receives the outer periphery of the wafer in a counterbore created in the inner periphery of the susceptor. A mixed gas consisting of a reaction gas and a carrier gas introduced into a film-forming chamber is caused to flow radially from a central portion of an upper face of the wafer by centrifugal force due to the rotation of the wafer, and is swept out toward the outer periphery, and then discharged outside the film-forming chamber through a gas outlet.

When epitaxial growth reaction is performed in the reaction chamber, thin film created by the source gas is formed not only on the wafer but also on the susceptor supporting the wafer. If epitaxial growth reaction is performed on another wafer newly transferred into the reaction chamber, a new thin film tends to be produced on the former thin film on the susceptor, as this process continues the wafer can become stuck to the susceptor. As a result, it is difficult to transfer the wafer from the reaction chamber after the epitaxial film-forming process.

In addition, the wafer is heated to a predetermined temperature; temperature control thereof is performed during measuring the temperature of the susceptor. In this case, the temperature of the susceptor is generally known by measuring, by means of a radiation thermometer, brightness temperature of radiant light transmitted from the susceptor through a transmissive window of the film-forming chamber. However, the presence of the above-described thin film on the susceptor sometimes causes a variation in measurement result, which prevents accurate temperature measurement.

Therefore, etching is performed to remove the thin film formed on the susceptor. Such etching is performed every time a single epitaxial growth reaction is completed, or every time a predetermined number of times of epitaxial growth reactions is completed, and the thin film formed on the susceptor is removed each time. However, when the film thickness of the epitaxial film formed on the wafer increases, the film thickness of the film formed on the susceptor also increases, and the time required for etching increases accordingly. As a result, there is a problem that the time required for an epitaxial wafer manufacturing process also increases.

The present invention has been made to address the above issues. That is, an object of the present invention is to provide a film-forming apparatus and a film-forming method capable of suppressing, in the course of such a film-forming process as an epitaxial growth reaction, formation of an excess thin film around a substrate subjected to the film-forming process.

Other challenges and advantages of the present invention are apparent from the following description.

SUMMARY OF THE INVENTION

According to one aspect of the present invention, a film-forming apparatus comprising, a chamber, a first gas supply unit supplying a reaction gas for a film-forming process to the chamber, a substrate-supporting portion supporting a substrate placed in the chamber, a heating unit heating the substrate from below the substrate-supporting portion, a rotary drum supporting the substrate-supporting portion on a top thereof, and including the heating unit disposed therein, a rotary shaft disposed in a lower part of the chamber, and rotating the rotary drum, a reflector reflecting heat from the heating unit, surrounding the rotary drum, and being disposed so as to have an upper end higher in height than an upper end of the substrate-supporting portion, and a second gas supply unit supplying a hydrogen gas or an inert gas between the rotary drum and the reflector.

According to another aspect of the present invention, a film-forming apparatus comprising, a chamber, a first gas supply unit supplying a reaction gas for a film-forming process to the chamber, a substrate-supporting portion supporting a substrate placed in the chamber, a heating unit heating the substrate from below the substrate-supporting portion, a rotary drum supporting the substrate-supporting portion on a top thereof, and including the heating unit disposed therein, a rotary shaft disposed in a lower part of the chamber, and rotating the rotary drum, a reflector disposed so as to surround the rotary drum and reflecting heat from the heating unit, a second gas supply unit supplying hydrogen gas or inert gas between the rotary drum and the reflector, and a raising and lowering portion raising and lowering at least one of the rotary drum and the reflector.

According to another aspect of the present invention, a film-forming method comprising, placing a substrate on a substrate-supporting portion disposed on an upper portion of a rotary drum installed in a chamber, heating the substrate by a heating unit disposed inside the rotary drum, disposing a reflector reflecting heat from the heating unit so as to surround the rotary drum and to have an upper end of the reflector higher in height than a surface of the substrate and an upper end of the substrate-supporting portion, and while rotating the rotary drum, supplying a reaction gas onto the substrate and supplying a hydrogen gas or an inert gas between the rotary drum and the reflector to form a predetermined film on the substrate.

BRIEF DESCRIPTION OF THE DIAGRAMS

Figure 3:
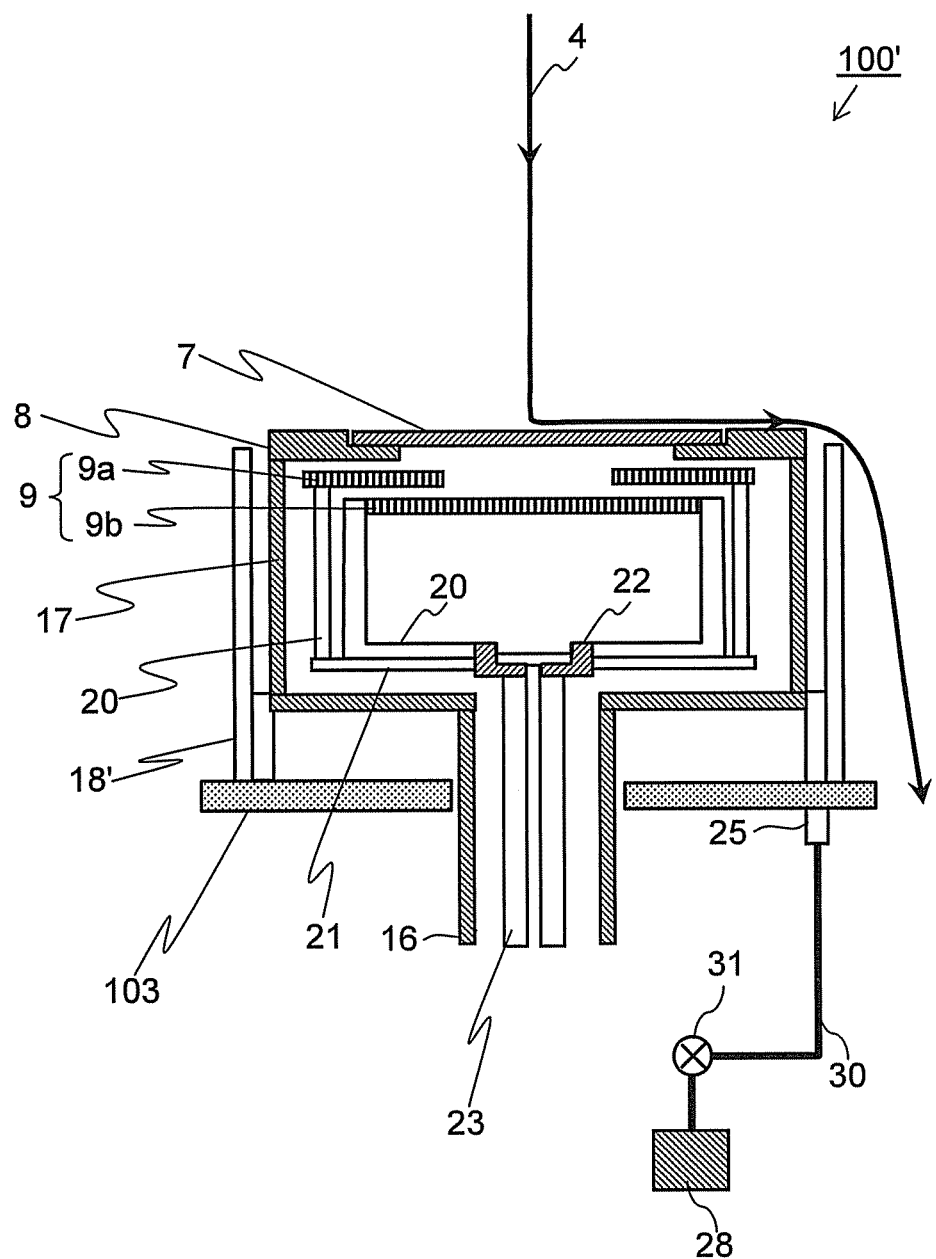
FIG. 3 is a part of expansion cross-sectional diagram of an epitaxial growth apparatus as a comparison example according to the embodiment 1.
Figure 4:
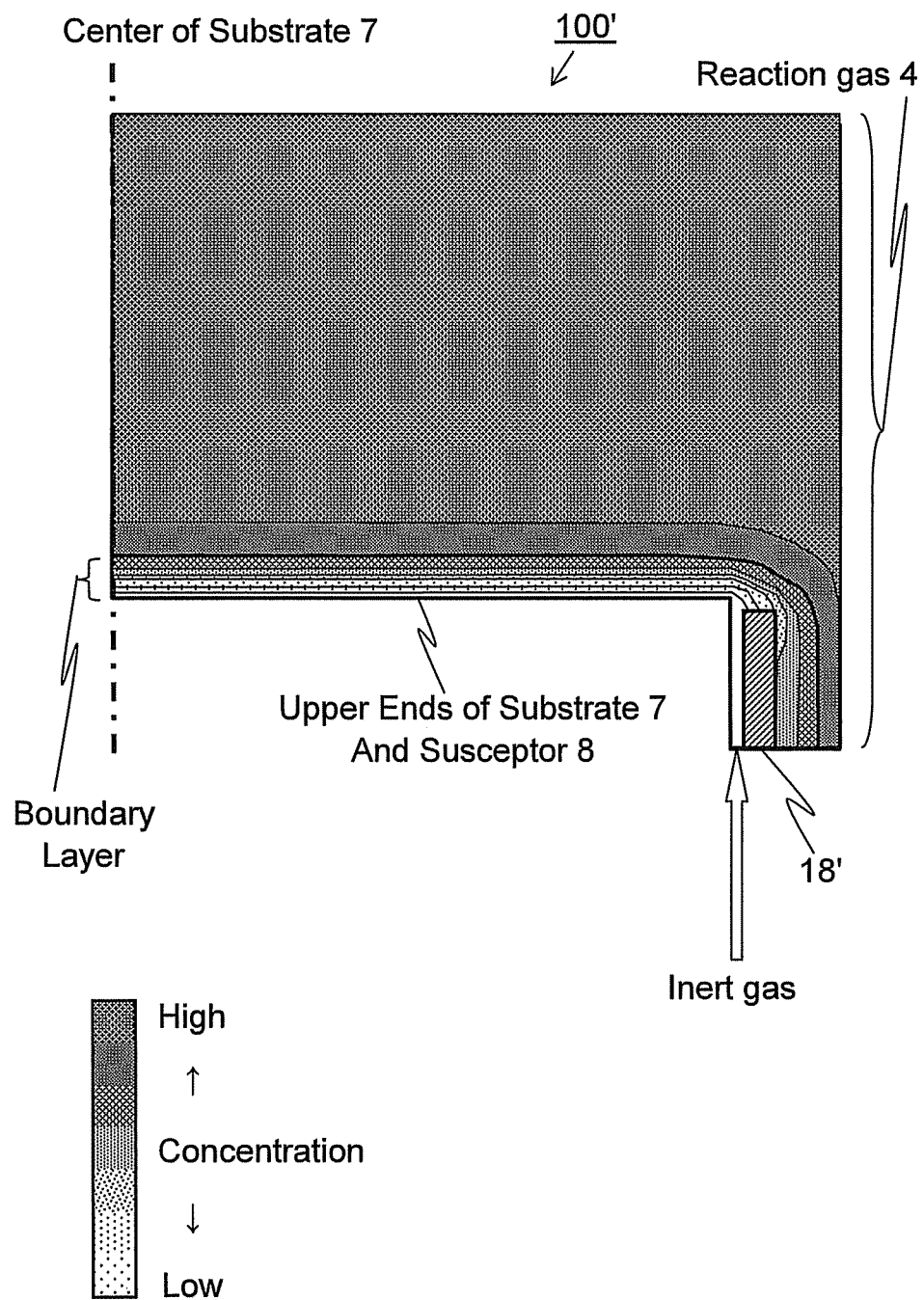

FIG. 4 schematically shows the concentration distribution of the reaction gas on the respective surfaces of the substrate and the susceptor in the epitaxial growth apparatus shown in FIG. 3.

Figure 5:
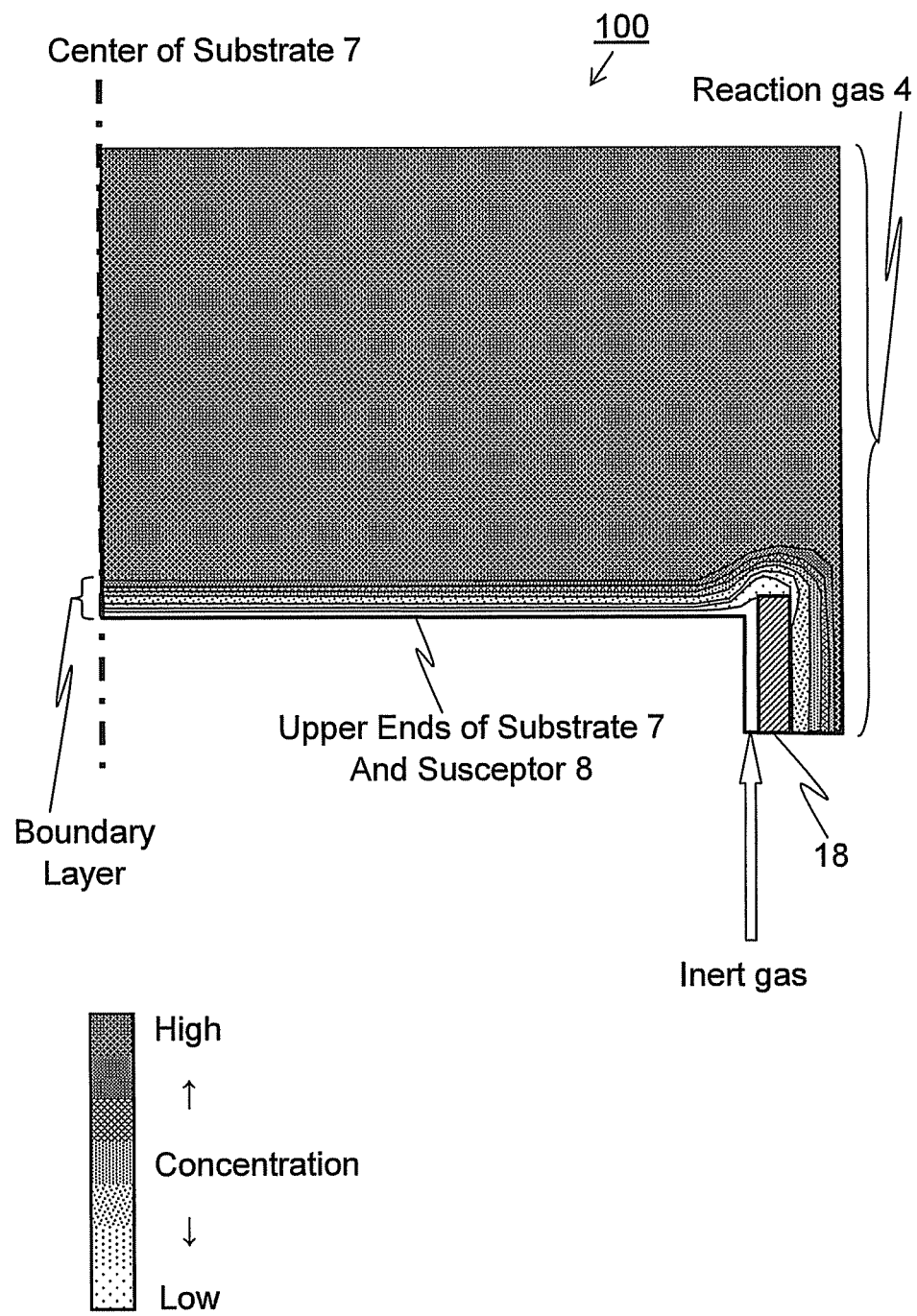

FIG. 5 schematically shows the concentration distribution of the reaction gas on the respective surfaces of the substrate and the susceptor in the epitaxial growth apparatus according to embodiment 1.

Figure 6:
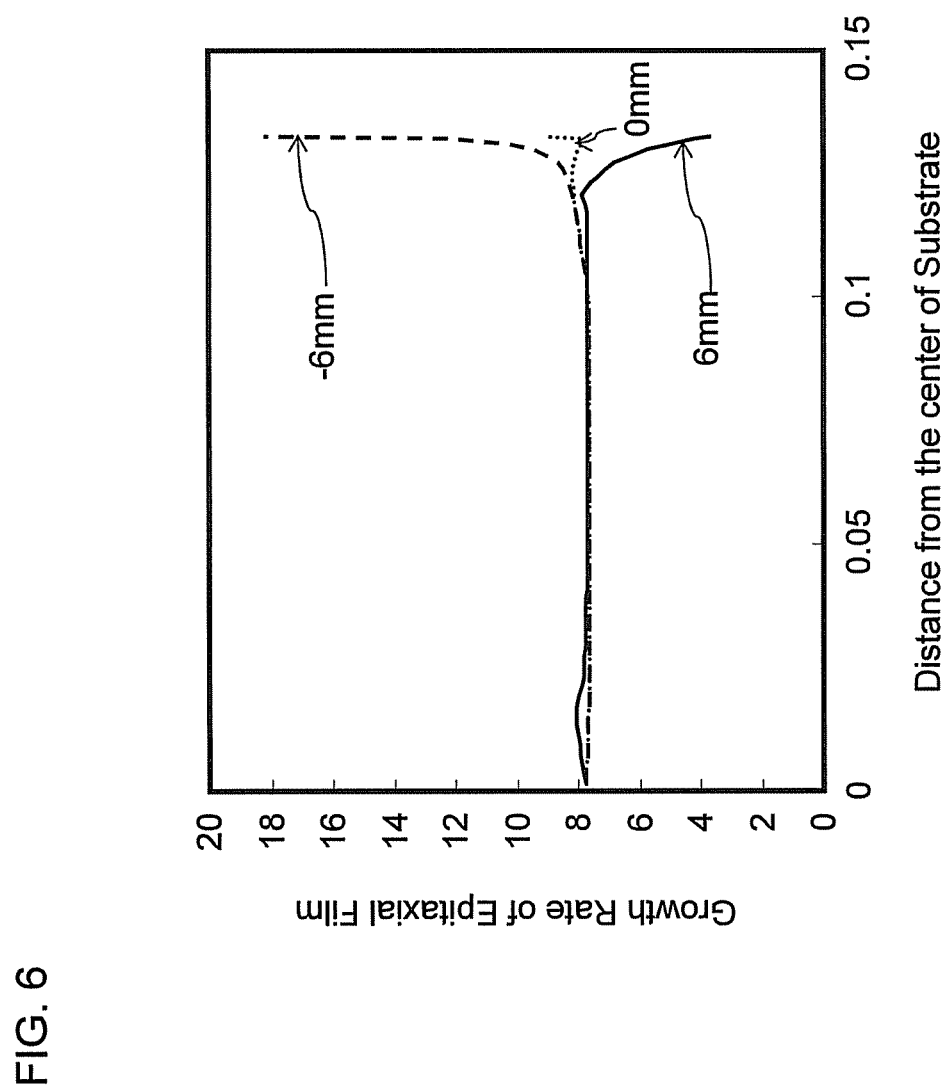

FIG. 6 is an example of a result of a simulation of a relationship between a distance from the center of the substrate and the growth rate of the epitaxial film with the upper end face of the reflecting ring and the surface of the substrate made different in height from each other.

Figure 7:
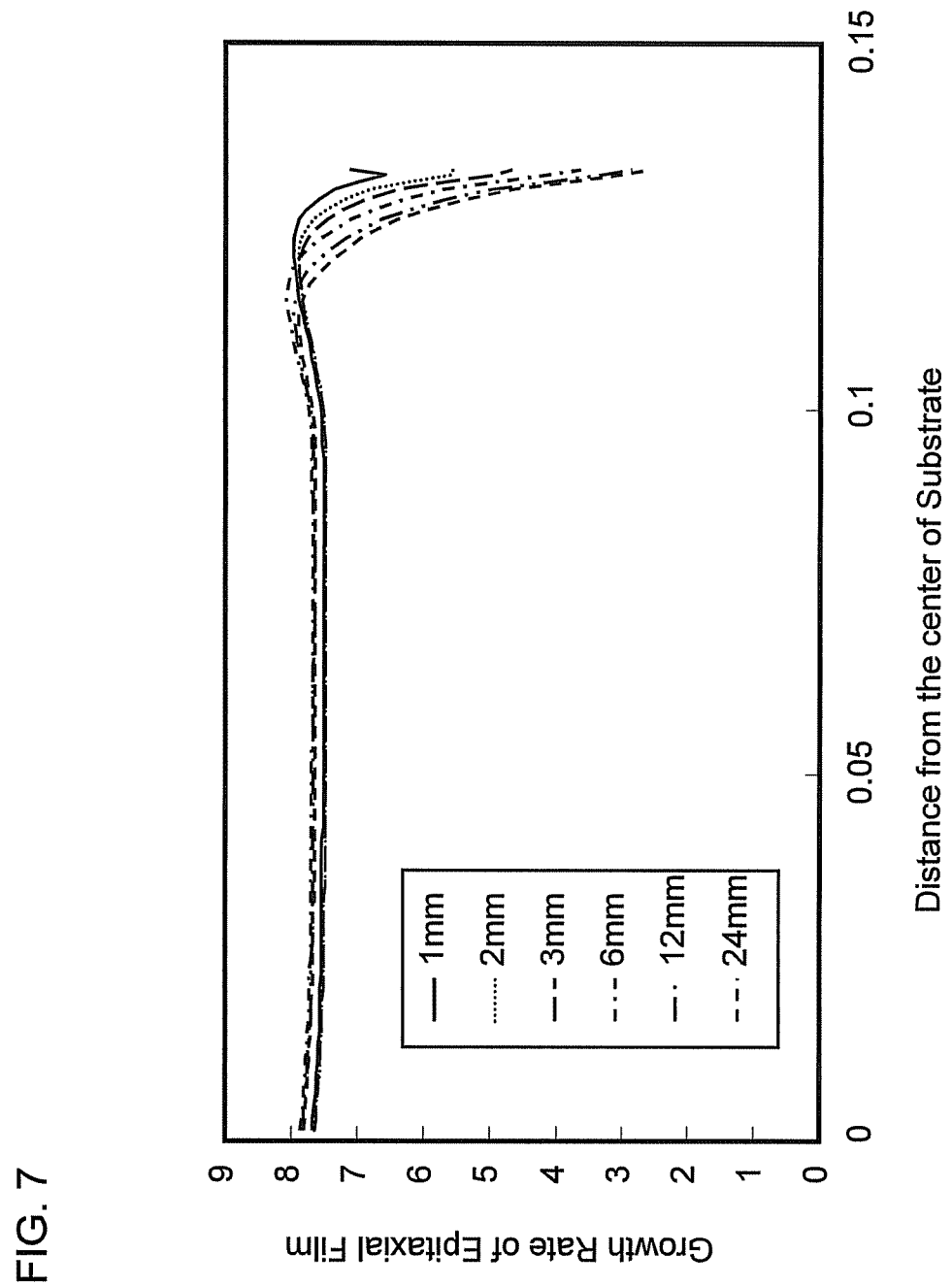

FIG. 7 is another example of a result of a simulation of a relationship between a distance from the center of the substrate and the growth rate of the epitaxial film with the upper end face of the reflecting ring and the surface of the substrate made different in height from each other.

Figure 8:
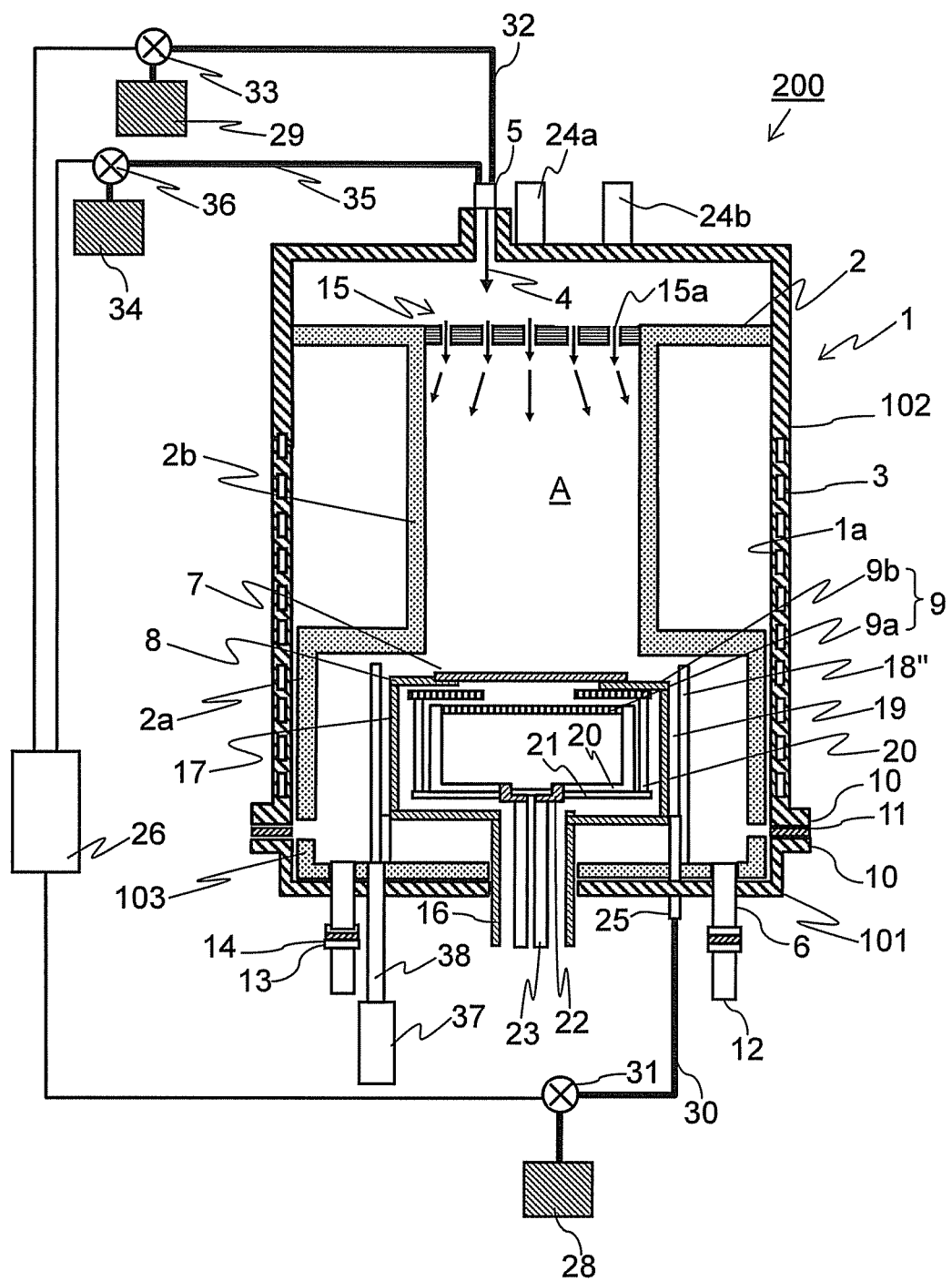

FIG. 8 is a schematic cross sectional view of a film-forming apparatus according to embodiment 2.

Figure 9:
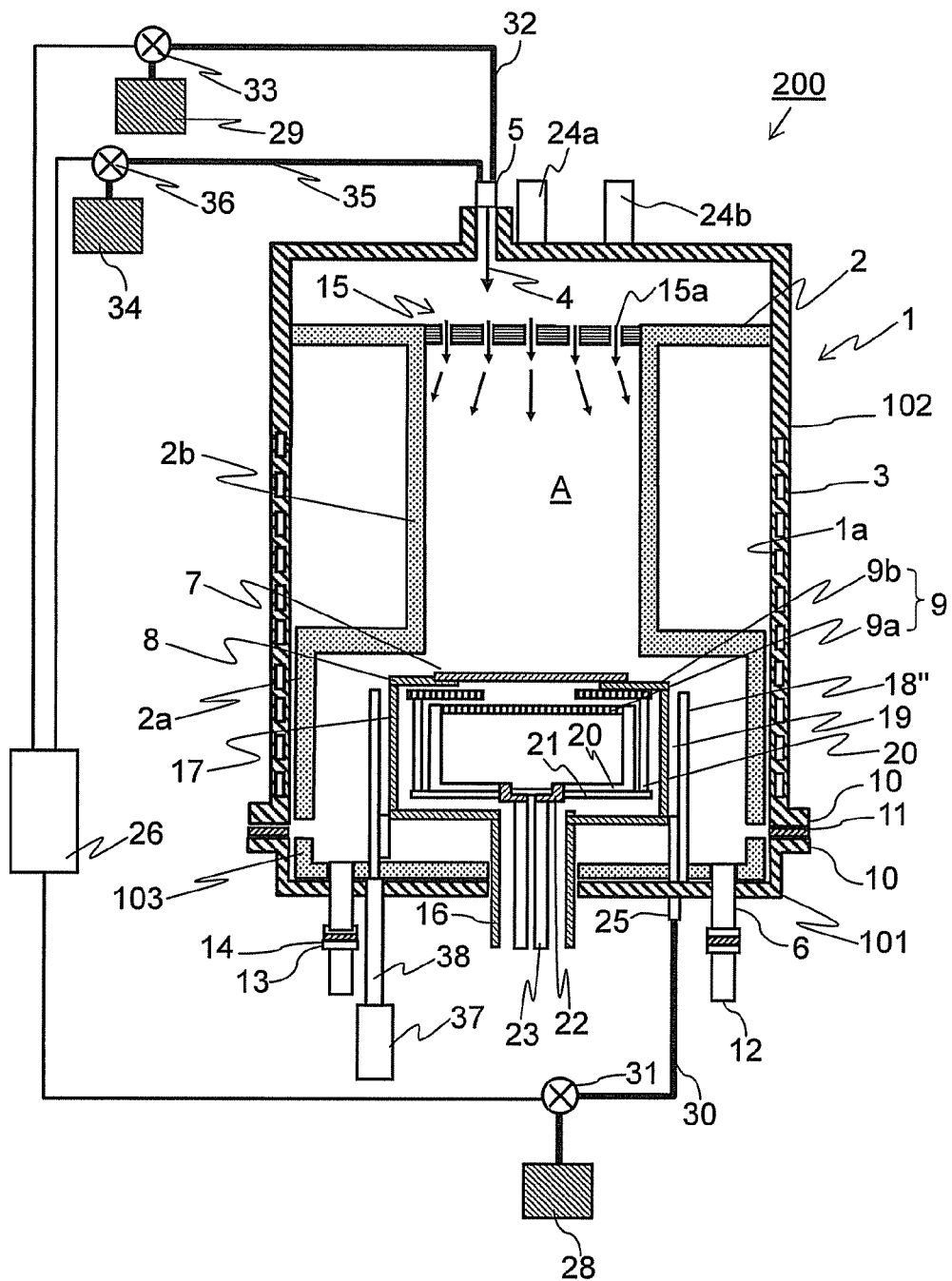

FIG. 9 shows the state of lowering of the reflecting ring in FIG. 8.

DETAILED DESCRIPTION OF THE INVENTION

Embodiment 1

Figure 1:
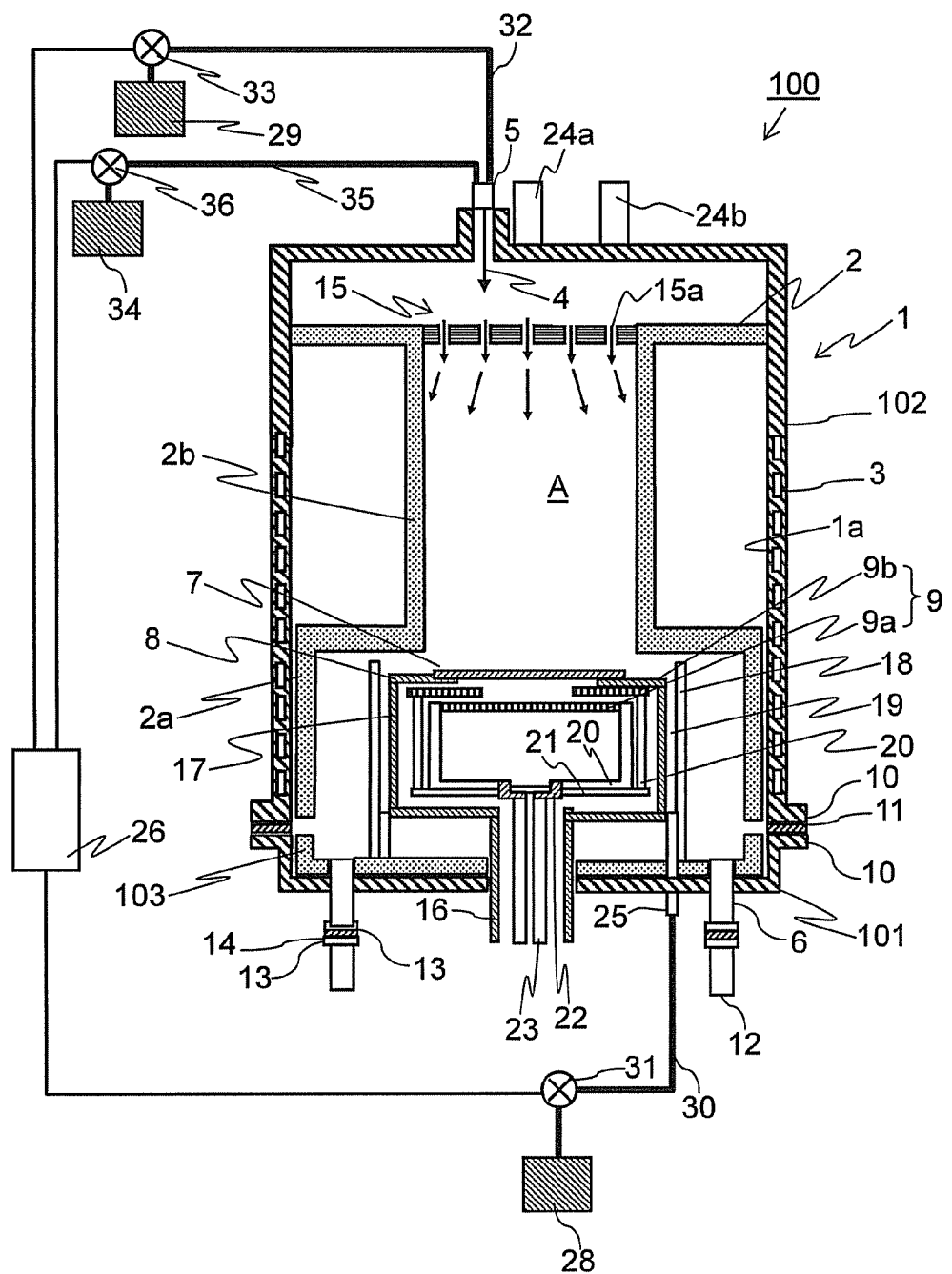
FIG. 1 is a schematic cross sectional view of a film-forming apparatus according to embodiment 1.

FIG. 1 is a schematic cross sectional view of a film-forming apparatus as one example of epitaxial film-forming apparatus according to the present embodiment. In this drawing some components are omitted with the exception of necessary components required to explain the present embodiment, the scale of this drawing is also different from an actual apparatus, so that each component is clearly visible. In the diagrams, FIG. 2 to FIG. 5, and FIG. 8 and FIG. 9 are the same as FIG. 1, in that some components are omitted and the scale differs from the actual apparatus.

In FIG. 1, a predetermined epitaxial film is formed on the substrate 7 by the epitaxial growth apparatus 100. For example, Si (silicon) film, Gan (gallium nitride) film, AlGaN (aluminum gallium nitride) or AlN (aluminum nitride) film is preferable as an epitaxial film.

As shown in FIG. 1, an epitaxial growth apparatus 100 includes a chamber 1. The chamber 1 has a belljar-shaped body 102 positioned on the base plate 101. A base plate cover 103 is provided and is detachable from the base plate 101, the base plate cover 103 is provided on the base plate 101, and has a shape and size which can cover the whole of the base plate 101. The material of the base plate cover 103 consists of, as one example, quartz. The base plate 101 is connected to the belljar-shaped body 102 via a flange 10. The flange 10 is sealed with packing 11. The base plate 101 is made of, as one example, stainless steel.

During the epitaxial growth reaction, the temperature will be very high in the chamber 1. Therefore, flow channels 3 allow cooling water to cool the chamber 1 are arranged in the base plate 101 and the belljar-shaped body 102.

A supply portion 5 for introducing the reaction gas 4 is provided in a belljar-shaped body 102. In addition, the gas inlet 5 is connected with a reaction gas reservoir 29 via a reaction gas supply pipe 32. The reaction gas reservoir 29 has a source gas reservoir (not illustrated) and a carrier gas reservoir (not illustrated), and gases discharged from these reservoirs are mixed and supplied as a reaction gas 4. Incidentally, it is possible to supply only the carrier gas from the reaction gas reservoir 29. Opening and closing a valve 33 performs the supply of the reaction gas 4 to the chamber 1. The opening and closing of the valve 33 is controlled by a control unit 26. Incidentally, the gas inlet 5, the reaction gas supply pipe 32, the reaction gas reservoir 29, and the valve 33 are examples of elements constituting a first gas supply unit in the present invention.

In the epitaxial film-forming apparatus 100, a film-forming process on the substrate 7 and an etching process for removing a thin film formed on a susceptor 8 are performed in the same chamber 1. Therefore, an etching gas reservoir 34 introducing an etching gas into the chamber 1 is connected to the gas inlet 5 through an etching gas supply pipe 35. The supply of the etching gas to the chamber 1 is performed by opening and closing a valve 36. The opening and closing of the valve 36 is also controlled by the control unit 26. Incidentally, the gas inlet 5, the etching gas supply pipe 35, the etching gas reservoir 34, and the valve 36 are examples of elements constituting a third gas supply unit in the present invention.

The base plate 101 has a discharge portion 6. The process gas after the reaction, and the process gas not reacted, flows through the discharge portion 6.

The discharge portion 6 is connected with a pipe 12 via the flange 13. Packing 14 seals the flange 13. Packing 11 and 14 consist of, as one example, fluorine-containing rubber having a capacity for resisting heat of up to approximately 300° C.

A hollow column-shaped liner 2 is positioned in the chamber 1. The liner 2 is arranged between an inner wall 1a of the chamber 1 and a space A in which the epitaxial growth reaction is performed on the substrate 7. The liner 2 prevents the inner wall 1a from being damaged by the reaction gas 4. As the epitaxial growth reaction is performed at high temperature, the liner 2 should consist of materials having a high capacity for resisting heat, for example, SiO2, SiC or carbon-coated SiC.

In the present embodiment, the liner 2 is separated into body portions 2a and a top portion 2b for convenience of explanation. The top portion 2a is a part in which the susceptor 8 is placed. The top portion 2b has a smaller inner diameter than the body portion 2a. The liner 2 consists of the body portion 2a and the top portion 2b combined into one body. The top portion 2b is arranged above the body portion 2a.

The shower plate 15 is fitted into the upper opening of the top portion 2b. The shower plate 15 functions as a flow-straightening vane to uniformly supply the reaction gas 4 to the surface of the substrate 7. The shower plate 15 has a plurality of through-holes 15a. When the reaction gas 4 is supplied from the supply portion 5 into the chamber 1, the reaction gas 4 flows downward towards the substrate 7 via the through-holes 15a. Accordingly, the inner diameter of the top portion 2b is laid out so as to be smaller than the body portion 2a. The inner diameter of the top portion 2b may be equal to the inner diameter of the body portion 2a, however, in terms of bringing the reaction gas 4 to the surface of the substrate 7 efficiently without diffusing the reaction gas 4 unnecessarily, it is preferred that the inner diameter of the top portion 2b be smaller than that of the body portion 2a. Specifically, the inner diameter of the top portion 2b is determined in consideration of the position of the through-holes 15a and the size of the substrate 7.

The susceptor 8 as a substrate-supporting portion for supporting the substrate 7 is provided on the body portion 2 positioned in the chamber 1, specifically, in the body portion 2a of the liner 2. In order to form a SiC epitaxial film, the temperature of the substrate 7 needs to be increased to 1500° C. or higher. For this reason, the susceptor 8 needs to be made of highly heat-resistant material. More specifically, one obtained by coating the surface of isotropic graphite with SiC by CVD (Chemical Vapor Deposition) is used (as one example).

The susceptor has a counterbore provided thereon so that the outer periphery of the substrate 7 can be positioned in the counterbore. Examples can include a ring shape and a solid disk shape. For example, the susceptor 8 can have a structure composed of a ring-like first susceptor portion supporting the outer periphery of a wafer and a disk-like second susceptor portion tightly fitted to an opening of the first susceptor portion. Alternatively, as shown in FIG. 1, the susceptor 8 can have a structure composed of only the ring-like susceptor portion and not having the second susceptor portion. Incidentally, in some cases, this structure is particularly referred to as a holder so as to be differentiated from the susceptor, but in the specification of the present application, these structures including the holder, are collectively referred to as susceptors.

The rotating shaft 16, and the rotating cylinder 17 positioned on the top of the rotating shaft 16 are located in the body portion 2a of the liner 2. The susceptor 8 is attached to the rotating cylinder 17. The rotating shaft 16 is rotated, and then the susceptor 8 is rotated via the rotating cylinder 17. When the epitaxial growth reaction is performed, the substrate 7 is placed on the susceptor 8, and then the substrate 7 is rotated with the susceptor 8.

The heater 9 positioned in the rotating cylinder 17 heats the substrate 7. The heater 9 can be a resistive heater, and has a disk shaped in-heater 9a and a ring shaped out-heater 9b. The in-heater 9a is placed at the position corresponding to the substrate 7. The out-heater 9b is placed above the in-heater 9a, and at the position corresponding to outer peripheral of the substrate 7. As a result of the gas flow the temperature of the outer periphery of the substrate 7 is lower than the inner periphery, the outer heater 9b can be used to prevent a drop in temperature of the outer periphery.

The in-heater 9a and the out-heater 9b are supported by an electrically conductive arm-like busbar 20. The busbar 20 is made of, for example, a SiC-coated carbon material. The busbar 20 is supported by the heater base 21 made of quartz, at the opposite side of the in-heater 9a and the out-heater 9b. The connecting portions 22 connect the busbars 20. The connecting portions 22 are formed of a metal such as molybdenum. Electricity can be conducted from rod electrodes 23 through the busbars 20 to the in-heater 9a and the out-heater 9b. Specifically, electricity is conducted from the rod electrodes 23 to a heat source of the in-heater 9a and the out-heater 9b, and then the temperature of the heat source will increase. Incidentally, the in-heater 9a, the out-heater 9b, the busbar 20, the heater base 21, the connecting portions 22, and the rod electrodes 23 constitute a heating unit of the present invention.

The surface temperature of the substrate 7 is measured by radiation thermometers 24a and 24b. In FIG. 1, the temperature at the center of the substrate 7 is measured by the radiation thermometer 24a. The outer temperature of the substrate 7 is measured by the radiation thermometer 24b. These radiation thermometers are arranged at the upper position of the chamber 1 as shown in FIG. 1. It is preferred that the upper portion of the belljar-shaped body 102 and the shower plate 15 be formed of quartz, because the use of quartz prevents the temperature measurement of the radiation thermometers 24a and 24b becoming affected. After temperature measurement, the data of the measurement is sent to a control device (not shown) and then fed back to an output control device of the in-heater 9a and the out-heater 9b.

The epitaxial growth apparatus 100 of the first embodiment is provided with a reflecting ring 18, which as shown in FIG. 1, is positioned outside the rotary drum 17 and extending linearly from base plate 103 to beyond a top of susceptor 8, so as to surround the rotary drum 17. Incidentally, the reflecting ring 18 constitutes a reflector in the present invention. By providing the reflecting ring 18 in the epitaxial growth apparatus 100, heat from the heater 9 is reflected by the reflecting ring 18, so that the heating efficiency to the substrate 7 placed on the susceptor 8 is improved. In addition, thermal conduction to the outside of the rotary drum 17 is suppressed, so that thermal deterioration of surrounding members can be reduced.

A gas passageway 19, which is a passageway of an inert gas, such as Ar (argon), is created between the rotary drum 17 and the reflecting ring 18. Incidentally, the passageway may be used as a passageway for an $H_2$ (hydrogen) gas, instead of the inert gas.

The inert gas is supplied to the gas passageway 19 through a gas inlet 25. Then, through the gas passageway 19, the inert gas flows upward in the chamber 1 from a clearance between the susceptor 8 and the reflecting ring 18.

The gas inlet 25 is connected with an inert gas supply pipe 30. An inert gas, such as Ar (argon), is stored in an inert gas reservoir 28. Incidentally, the inert gas reservoir 28 may be used as a reservoir for an $H_2$ (hydrogen) gas, instead of the inert gas. The supply of the gas to the gas passageway 19 is performed by opening and closing a valve 31. The opening and closing of the valve 31 is controlled by the control unit 26. Incidentally, the gas inlet 25, the inert gas supply pipe 30, the inert gas reservoir 28, and the valve 31 are examples of elements constituting a second gas supply unit in the present invention.

In the epitaxial film-forming apparatus 100, a film-forming process on the substrate 7 and an etching process for removing a thin film formed on a susceptor 8 are performed in the same chamber 1. The supply of the inert gas to the gas passageway 19 is performed in both the film-forming process and the etching process. This is to prevent the reaction gas 4 or the etching gas from entering the clearance between the rotary drum 17 and the reflecting ring 18 to corrode the surrounding members.

In the film-forming process, when the reaction gas 4 is introduced into the chamber 1 through the gas inlet 5, the reaction gas 4, as indicated by an arrow in FIG. 1, flows down through the through-holes 15a of the shower plate 15.

Figure 2:
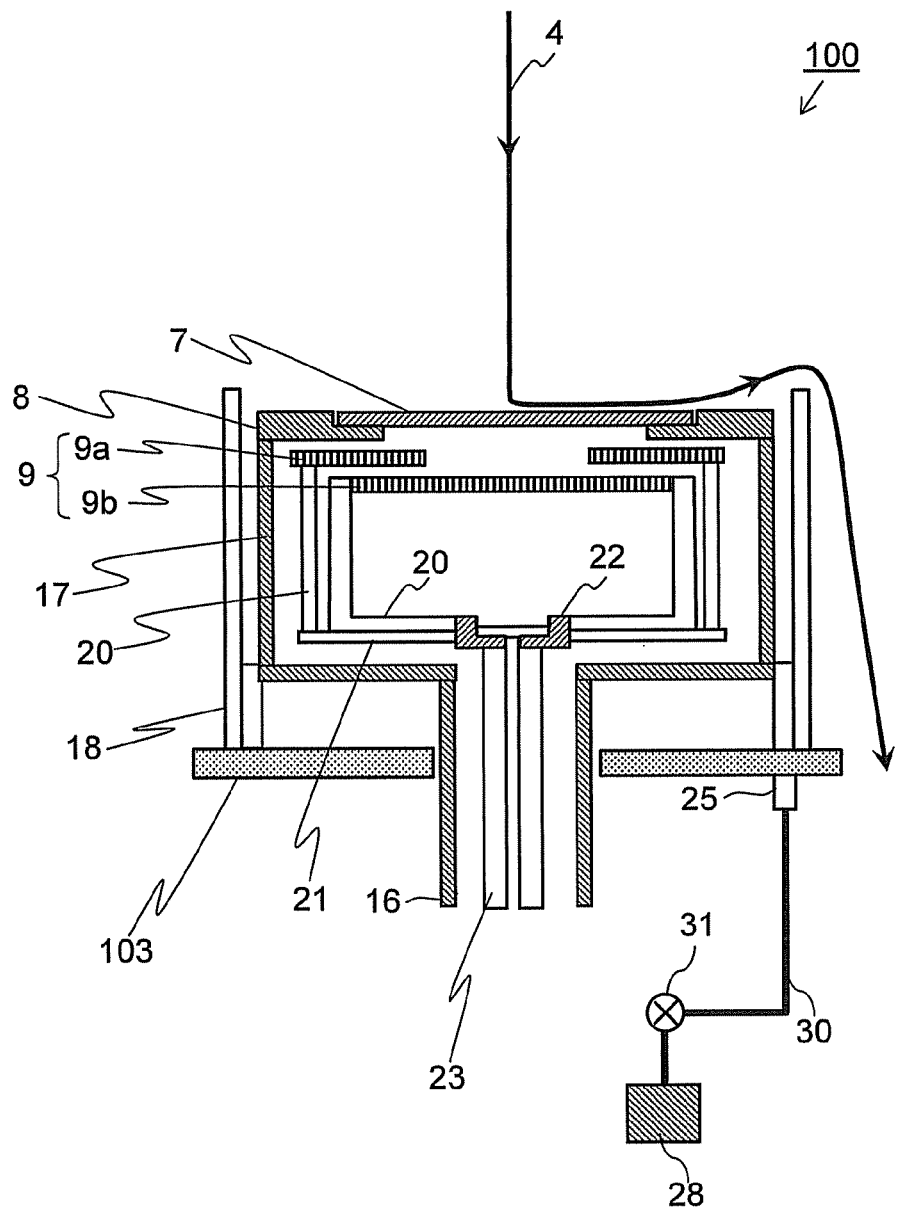
FIG. 2 is an expanded diagram of FIG. 1.

FIG. 2 is an expanded diagram of FIG. 1. As shown in FIG. 2, the reaction gas 4 is attracted by the substrate 7 while the substrate 7 is rotating, and the reaction gas 4 forms a so-called vertical flow in a region extending from the shower plate 15 to the surface of the substrate 7. When the reaction gas 4 reaches the substrate 7, the reaction gas 4 flows without turbulence as a substantially laminar flow in a horizontal direction along the upper surface of the substrate 7. As described above, the reaction gas 4 then comes into contact with the surface of the substrate 7. Then, an epitaxial film is formed on the surface of the substrate 7 by a pyrolytic reaction or a hydrogen reduction of the reaction gas 4 on the surface of the substrate 7. The film-forming apparatus 100 is configured so that the gap between the periphery of the substrate 7 and the liner 2 is minimized to allow the reaction gas 4 to flow more uniformly onto the surface of the substrate 7.

As shown in FIG. 1, the epitaxial growth apparatus 100 is configured so that the gap between the periphery of the substrate 7 and the liner 2 is minimized to allow the reaction gas 4 to flow more uniformly onto the surface of the substrate 7.

In the epitaxial growth apparatus 100, when epitaxial growth reaction is performed in the chamber 1, thin film created by the source gas is formed not only on the substrate 7 but also on the susceptor supporting the substrate 7. If epitaxial growth reaction is performed on another substrate 7 newly transferred into the chamber 1, a new thin film tends to be produced on the former thin film, as this process continues the substrate 7 can become stuck to the susceptor. It is difficult to transfer the substrate 7 from the chamber 1 after the epitaxial film-forming process. In addition, the thin film can crumble to dust, causing the epitaxial film to become defective, and also becomes a cause of reduction in product yield.

Therefore, the present invention has been constructed to effectively reduce the concentration of the reaction gas 4 on the susceptor 8 in order to suppress the formation of the thin film on the susceptor 8 due to the reaction gas 4. Specifically, this is achieved by adjusting a relative positional relationship between an upper end face of the reflecting ring 18, the surface of the substrate 7, and an upper end face of the susceptor 8.

The first embodiment is characterized in that the upper end face of the reflecting ring 18 is higher in height than both the surface of the substrate 7 and the upper end face of the susceptor 8. An advantageous effect of such a characteristic will be described with use of a comparative example.

FIG. 3 is a part of expansion cross-sectional diagram of an epitaxial growth apparatus as a comparison example according to the present embodiment. In FIG. 3, the symbols used are the same as in FIG. 1 and FIG. 2.

An epitaxial growth apparatus 100' shown in FIG. 3 is different from the epitaxial growth apparatus 100 of the first embodiment in that the upper end face of the reflecting ring 18' is lower in height than both the surface of the substrate 7 and the upper end face of the susceptor 8.

In the epitaxial growth apparatus 100' as shown in FIG. 3, the reaction gas 4 is attracted by the substrate 7 while the substrate 7 is rotating, and the reaction gas 4 forms a so called vertical flow in a region extending from the shower plate 15 to the surface of the substrate 7. When the reaction gas 4 reaches the substrate 7, the reaction gas 4 flows without turbulence as a substantially laminar flow in a horizontal direction along the upper surface of the substrate 7. As described above, the reaction gas 4 then comes into contact with the surface of the substrate 7. Then, an epitaxial film is formed on the surface of the substrate 7 by a pyrolytic reaction or a hydrogen reduction of the reaction gas 4 on the surface of the substrate 7. The film-forming apparatus 100 is configured so that the gap between the periphery of the substrate 7 and the liner 2 is minimized to allow the reaction gas 4 to flow more uniformly onto the surface of the substrate 7. Next, the reaction gas 4 not used for the epitaxial growth reaction, and the gas produced by the epitaxial growth reaction, flows from the discharge portion 6 provided below/underneath chamber 1.

In the epitaxial growth apparatus 100' in FIG. 3, the upper end face of the reflecting ring 18' is lower in height than both the surface of the substrate 7 and the upper end face of the susceptor 8. Therefore, the reaction gas 4, which has arrived at the surface of the substrate 7, moves from the outer periphery of the substrate 7 toward the outer periphery of the susceptor 8, and then flowing downward, as indicated by the arrow in FIG. 3.

In the epitaxial growth apparatus 100 according to the present embodiment as shown in FIG. 2, the upper end face of the reflecting ring 18 is higher in height than both of the surface of the substrate 7 and the upper end face of the susceptor 8. Therefore, after the reaction gas 4 which has arrived at the surface of the substrate 7 moves from the outer periphery of the substrate 7 toward the outer periphery of the susceptor 8, it rises once in order to pass over the reflecting ring 18, as indicated by the arrow in FIG. 2. Then, the reaction gas 4, which has passed over the reflecting ring 18, moves so as to flow downward.

By the way, the inert gas is jetted out upward from between the rotary drum 17 and the reflecting ring 18'. Therefore, the concentration of the reaction gas 4 has a non-uniform distribution near the surfaces of the substrate 7 and the susceptor 8. This region where the concentration varies is referred to as "boundary layer".

FIG. 4 schematically shows the concentration distribution of the reaction gas 4 on the respective surfaces of the substrate 7 and the susceptor 8 in the epitaxial growth apparatus 100' shown in FIG. 3. On the other hand, FIG. 5 schematically shows the concentration distribution of the reaction gas 4 on the respective surfaces of the substrate 7 and the susceptor 8 in the epitaxial growth apparatus 100 in FIG. 2. Incidentally, in both FIGS. 4 and 5, the respective surfaces of the substrate 7 and the susceptor 8 are set at the same height, however their heights may be different from each other.

A comparison between FIGS. 4 and 5 shows that there is a difference in thickness between the boundary layers near the reflecting rings 18 and 18'. That is, the boundary layer near the reflecting ring 18 (FIG. 5) is thicker than the boundary layer near the reflecting ring 18' (FIG. 4). The reason is that the reaction gas 4, which has passed over the reflecting ring so as to flow downward as shown in FIG. 5. Therefore, after the reaction gas 4 which has arrived at the surface of the substrate 7 moves from the outer periphery of the substrate 7 toward the outer periphery of the susceptor 8, it rises once in order to pass over the reflecting ring 18, as indicated by the arrow in FIG. 2.

An increase in the thickness of the boundary layer increases a distance between a region where the concentration of the reaction gas 4 is high and the surface of the susceptor 8. On the other hand, in the region where the concentration of the reaction gas 4 is high, the thin film due to the reaction gas 4 is easily formed. As described above, the distance between the region where the concentration of the reaction gas 4 is high and the surface of the susceptor, as shown in FIG. 5, is larger than the distance in the example seen in FIG. 4. Accordingly, in the configuration in FIG. 5, as compared with FIG. 4, the formation of the thin film on the susceptor 8 can be suppressed.

FIG. 6 is an example of a result of a simulation of a relationship between a distance from the center of the substrate and the growth rate of the epitaxial film with the upper end face of the reflecting ring and the surface of the substrate made different in height from each other. Incidentally, the respective surfaces of the substrate and the susceptor are set at the same height, but their heights may be different from each other.

When the difference between the height of the reflecting ring and the height of the substrate surface is "−6 mm", the upper end face of the reflecting ring is lower in height than both the surface of the substrate and the upper end face of the susceptor. That is, this corresponds to the configuration of the comparative example shown in FIG. 3. In this case, the growth rate of the epitaxial film sharply increases outside the substrate. This tendency is consistent with the fact that the region where the concentration of the reaction gas 4 is high moves downward, namely, approaches the vicinity of the susceptor 8, outside the substrate 7 in FIG. 4.

Next, when the difference between the height of the reflecting ring and the height of the substrate surface is "0 mm", the upper end face of the reflecting ring, the surface of the substrate, and the upper end face of the susceptor are at the same height. In this case, the growth rate of the epitaxial film still has a tendency to rise outside the substrate, though less sharply than in the above case "the difference is −6 mm".

On the other hand, when the difference between the height of the reflecting ring and the height of the substrate surface is "6 mm", the upper end face of the reflecting ring is higher in height than both the surface of the substrate and the upper end face of the susceptor. That is, this corresponds to the configuration of the first embodiment shown in FIG. 2. In this case, the growth rate of the epitaxial film sharply decreases outside the substrate. This tendency is consistent with the fact that the region where the concentration of the reaction gas 4 is high moves upward, namely, away from the susceptor 8, outside the substrate 7 in FIG. 5.

Thus, in the epitaxial film-forming apparatus 100 of the first embodiment, since the upper end face of the reflecting ring 18 is higher in height than both the surface of the substrate 7 and the upper end face of the susceptor 8, the region where the concentration of the reaction gas 4 is high can be positioned away from the susceptor 8 outside the substrate 7. Therefore, the formation of the thin film on the surface of the susceptor 8 due to the reaction gas 4 can be suppressed, so that the number of epitaxial substrates manufactured per unit time can be improved by reducing the frequency of etching for thin film removal.

FIG. 7 is another example of a result of a simulation of a relationship between a distance from the center of the substrate and the growth rate of the epitaxial film with the upper end face of the reflecting ring and the surface of the substrate made different in height from each other. Here, the respective surfaces of the substrate and the susceptor are set at the same height, but their heights may be different from each other.

In FIG. 7, the difference between the height of the reflecting ring and the height of the substrate surface is changed to "1 mm", "2 mm", "3 mm", "6 mm", "12 mm", and "24 mm". In all these cases, the upper end face of the reflecting ring is higher in height than both the surface of the substrate and the upper end face of the susceptor. In each case, the growth rate of the epitaxial film sharply decreases outside the substrate, which shows that the effect of suppressing the formation of the thin film on the surface of the susceptor 8 can be obtained. Incidentally, when the difference is more than 12 mm, the growth rate of the epitaxial film remains almost unchanged, and therefore it is preferred that the difference be set in a range between 1 mm and 12 mm.

A preferred difference between the height of the reflecting ring and the respective heights of the substrate and the susceptor varies according to epitaxial film growth conditions. In the first embodiment, the preferred range can be set to a range between "a difference approximately equal to the thickness of the boundary layer" and "a difference of about twice the thickness of the boundary layer". Incidentally, if the difference is too large, there is a possibility that the concentration distribution of the reaction gas also varies on the surface of the substrate, and the film thickness of the epitaxial film formed on the substrate becomes uneven.

In the first embodiment, though the flow rate of the inert gas supplied to the gas passageway 19 in FIG. 1 can be set to be constant in both the film-forming process and the etching process, it is more preferred that the flow rate in the etching process be made larger than that in the film-forming process. Specifically, the flow rate is adjusted in the following manner.

As described above, in FIG. 1, the opening and closing operation of the respective valves 31, 33, and 36, is controlled by the control unit 26. While the substrate is being subjected to the film-forming process, the valves 33 and 31 are opened, and the valve 36 is closed. While the etching process is being performed, the valve 33 is closed, and the valve 36 is opened. On the other hand, though also remaining opened in the etching process, the valve 31 is adjusted so as to make the flow rate of the inert gas lower than in the film-forming process.

Changing the flow rate of the inert gas in the above manner provides the following advantageous effect.

In the etching process, the thin film, which has been formed on the susceptor 8, is removed. The etching gas is introduced into the chamber 1 through the gas inlet 5 in FIG. 1. Incidentally, at this time, a dummy substrate 7 is placed on the susceptor 8, and the etching process is performed while the dummy substrate 7 is being rotated.

For example, in the film-forming process of a Si (silicon) epitaxial film, in order to remove the Si epitaxial film formed on the susceptor 8, an HCl (hydrogen chloride) gas is used as an etching gas. Further, in the film-forming process of a GaN (gallium nitride) epitaxial film, in order to remove the GaN epitaxial film formed on the susceptor 8, an HCl gas or a $Cl_2$ (chlorine) gas is used as an etching gas.

The flow of the etching gas introduced, is the same as the flow of the reaction gas as shown in FIG. 1 and FIG. 2. The etching gas is attracted by the substrate 7 while the substrate 7 is rotating, and the etching gas forms a so-called vertical flow in a region extending from the shower plate 15 to the surface of the substrate 7. When the etching gas reaches the substrate 7, the etching gas flows without turbulence as a substantially laminar flow in a horizontal direction along the upper surface of the substrate 7. The new etching gas then comes into contact with the surface of the substrate 7. The thin film on the susceptor 8 is removed by etching process.

As described above, since the inert gas is also supplied to the gas passageway 19 in the etching process, the concentration of the etching gas has a non-uniform distribution. Incidentally, a region where the concentration of the etching gas varies is also referred to as "boundary layer". At this time, in order to remove the thin film on the susceptor 8 efficiently, it is preferred that a region where the concentration of the etching gas is high be closer to the susceptor 8. That is, it is preferred that the thickness of the boundary layer be thin.

On the other hand, in the epitaxial growth process, in order to slow the growth rate of the thin film formed on the susceptor 8, it is preferred that the region where the concentration of the reaction gas 4 is high be far from the susceptor 8. That is, it is preferred that the thickness of the boundary layer be thick.

Increasing the flow rate of the inert gas supplied to the gas passageway 19 can increase the thickness of the boundary layer. On the other hand, reducing the flow rate of the inert gas supplied to the gas passageway 19 can reduce the thickness of the boundary layer. That is, by causing the control unit 26 to change the flow rate of the inert gas according to whether the reaction gas 4 is being supplied or the etching gas is being supplied, the thickness of the boundary layer can be adjusted according to the processes in the chamber 1. This enables the thin film formation on the susceptor 8 during the epitaxial growth reaction to be suppressed, and enables this thin film to be removed efficiently by the etching process.

Embodiment 2

As described in the first embodiment, in order to remove the thin film on the susceptor efficiently, it is preferred that the region where the concentration of the etching gas is high be closer to the susceptor. On the other hand, in the epitaxial growth process, in order to slow the growth rate of the thin film formed on the susceptor, it is preferred that the region where the concentration of the reaction gas is high be farther from the susceptor.

The concentration distribution of the etching gas in the etching process can be considered to function in the same manner as the concentration distribution of the reaction gas in the epitaxial growth process. Therefore, when the concentration distributions in FIG. 4 and FIG. 5 explained in the first embodiment are applied to the etching gas, it is the case in FIG. 4 that the region where the concentration of the etching gas is high is closer to the susceptor 8.

In the first embodiment, FIG. 4 corresponds to the case where the upper end face of the reflecting ring 18' is lower in height than both the surface of the substrate 7 and the upper end face of the susceptor 8. Therefore, a preferred apparatus configuration in the etching process is such that the upper end face of the reflecting ring is lower in height than both the surface of the substrate and the upper end face of the susceptor.

On the other hand, FIG. 5 corresponds to a preferred apparatus configuration during the epitaxial growth process. That is, when the upper end face of the reflecting ring is higher in height than both the surface of the substrate and the upper end face of the susceptor, the formation of the thin film on the susceptor due to the reaction gas can be suppressed.

Thus, the preferred apparatus configuration in the etching process and the preferred apparatus configuration in the epitaxial growth process are in conflict with each other. Therefore, in a second embodiment, a relative relationship between the height of the upper end face of the reflecting ring and the respective heights of the surface of the substrate and the upper end face of the susceptor is changed according to whether the etching process is being performed or the epitaxial growth process is being performed.

FIG. 8 and FIG. 9 are schematic cross sectional views of a film-forming apparatus as one example of epitaxial film-forming apparatus according to the present embodiment. In these drawings, the same symbols as used in FIG. 1 are used to identify the same components; therefore, a detailed explanation of these components will be omitted.

An epitaxial growth apparatus 200 is different from the epitaxial growth apparatus 100 of the first embodiment (FIG. 1) in that a mechanism for raising and lowering a reflecting ring 18" is provided.

In FIG. 8, the epitaxial growth apparatus 200 forms a predetermined epitaxial film on the surface of the substrate 7. As the epitaxial film, for example, a Si (silicon) film, a GaN (gallium nitride) film, an AlGaN (aluminum gallium nitride) film, an AlN (aluminum nitride) film, and the like are preferred.

The epitaxial growth apparatus 200 is provided with a rod 38 whose upper end is connected to a lower face of the reflecting ring 18". The rod is an ascending and descending rod, capable of moving in an upward and downwards direction. A raising and lowering mechanism 37 is disposed below the chamber 1, and a lower end of the rod 38 is connected to the raising and lowering mechanism 37. The raising and lowering mechanism 37 controls the ascending and descending operation of the rod 38. Incidentally, the raising and lowering mechanism 37 and the rod 38 are examples of elements constituting a raising and lowering portion of the present invention.

FIG. 8 shows an epitaxial growth apparatus 200, when the epitaxial growth reaction is performed. In that case the upper end face of the reflecting ring 18 is higher in height than both the surface of the substrate 7 and the upper end face of the susceptor 8, according to this construction, as shown in embodiment 1, the region where the concentration of the reaction gas 4 is high can be positioned away from the susceptor 8 outside the substrate 7 (see FIG. 5). Therefore, the formation of the thin film on the surface of the susceptor 8 due to the reaction gas 4 can be suppressed.

In FIG. 8, when the rod 38 is lowered, the reflecting ring 18" descends together with the rod 38. This can put the epitaxial growth apparatus 200 into a state shown in FIG. 9.

FIG. 9 shows the state of the epitaxial growth apparatus 200 when the etching process is performed. In this case, an upper end face of the reflecting ring 18" is lower in height than both the surface of the substrate 7 and the upper end face of the susceptor 8. This state is the same as the example in FIG. 3 of the first embodiment. Therefore, like the concentration distribution of the reaction gas 4 shown in FIG. 4, the region where the concentration of the etching gas is high can be made closer to the susceptor 8 outside the substrate 7. Therefore, according to this configuration, the thin film formed on the surface of the susceptor 8 due to the reaction gas 4 can be removed efficiently.

After the etching process is completed, the raising and lowering mechanism 37 is controlled so as to raise the rod 38. Then, the reflecting ring 18" ascends via the rod 38. This brings the epitaxial growth apparatus 200 back to a state in FIG. 8, so that the configuration suitable for the epitaxial growth process can be restored.

In the state in FIG. 8, the difference between the height of the upper end face of the reflecting ring 18" and the respective heights of the surface of the substrate 7 and the upper end face of the susceptor 8 can be set, for example, in a range between 1 mm and 12 mm, as in the first embodiment. A preferred range of the difference, however, changes according to the growth conditions of the epitaxial film. In the first embodiment, the preferred range can be set to a range between "a difference approximately equal to the thickness of the boundary layer" and "a difference of about twice the thickness of the boundary layer". Incidentally, if the difference is too large, there is a possibility that the concentration distribution of the reaction gas also varies even on the surface of the substrate, and the film thickness of the epitaxial film formed on the substrate becomes uneven.

On the other hand, in FIG. 9, a preferred range of the difference between the height of the reflecting ring 18" and the respective heights of the substrate 7 and the susceptor 8 also changes according to the growth conditions of the epitaxial film, and, for example, the difference can be set in a range between 1 mm and 12 mm.

In the second embodiment, though the flow rate of the inert gas supplied to the gas passageway 19 can be set to be constant in both the film-forming process and the etching process, the flow rate in the etching process may be made different from the flow rate in the film-forming process, if necessary. The thickness of the boundary layer changes according to the growth conditions of the epitaxial film, and therefore a combination of raising and lowering the reflecting ring 18" and controlling the flow rate of the inert gas by means of the control unit 26 makes adaptation to a wide variety of growth conditions possible.

Incidentally, in the second embodiment, an example of raising and lowering the reflecting ring 18" has been described, but the second embodiment is not limited to this example. Instead of the mechanism for raising and lowering the reflecting ring 18", a mechanism for raising and lowering the rotary drum 17 may be provided. For example, a rod whose upper end is connected to a lower face of the rotary drum 17 is provided, a raising and lowering mechanism is disposed below the chamber 1, and a lower end of the rod is connected to the raising and lowering mechanism. Then, the raising and lowering mechanism may control the ascending and descending actions, of the rod.

In the second embodiment, in the epitaxial growth process, the upper end face of the reflecting ring 18" is set to be higher in height than both the surface of the substrate 7 and the upper end face of the susceptor 8, while in the etching process, the upper end face of the reflecting ring 18" is set to be lower in height than both the surface of the substrate 7 and the upper end face of the susceptor 8. This is achieved, as in the examples in FIGS. 8 and 9, by ascending and descending of the reflecting ring 18" with the rotary drum 17 fixed, but is also achieved, as described above, by ascending and descending of the rotary drum 17 with the reflecting ring 18" fixed. That is, the epitaxial film-forming apparatus of the second embodiment only needs to be provided with a raising and lowering portion which raises and lowers either the rotary drum 17 or the reflecting ring 18".

Embodiment 3

A film-forming method of a third embodiment is such that a substrate is placed on a substrate-supporting portion disposed above a rotary drum, the substrate is heated by a heating unit disposed inside the rotary drum, a reflector which reflects the heat from the heating unit is disposed so as to surround the rotary drum, and a reaction gas and a hydrogen gas or an inert gas are supplied onto the substrate and between the rotary drum and the reflector, respectively, while the rotary drum is being rotated, so that a predetermined film is formed on the substrate. This film-forming method is characterized in that an upper end of the reflector is set to be higher in height than both the surface of the substrate and an upper end of a substrate-supporting portion.

The film-forming method according to the present embodiment is described referring to the epitaxial growth apparatus 100 as seen in FIG. 1.

The epitaxial growth apparatus 100 is preferable for forming a Si epitaxial film. The below-mentioned is one example of Si epitaxial film-forming.

Firstly the substrate 7 is transferred into the chamber 1, and then is placed on the susceptor 8. For example, a SiC wafer or Si wafer can be used as the substrate 7, or the material of the substrate 7 may be, for example, $SiO_2$ (quartz) or another insulator. A highly resistive semi-insulating substrate such as GAas (gallium arsenide) can also be used. Further a sapphire substrate can be used.

Next, Si film is formed on the substrate 7.

For example, a Si wafer is used as the substrate 7, and then it is placed on the susceptor 8.

Then, H2 (hydrogen) gas as a carrier gas is flowed from the reaction gas reservoir 29 under ordinary pressure or an appropriately reduced pressure. At this time, the source gas is not supplied. During this process, that is, the carrier gas flowing from the reaction gas reservoir 29 under ordinary pressure or an appropriately reduced pressure, and the source gas not being supplied, the Si wafer is rotated with the susceptor 8 at about 50 rpm.

Then, the Si wafer is heated to a temperature within a range of 1100° C. to 1200° C. by the heater 9. After it is confirmed that the temperature of the Si wafer measured by the radiation thermometer 24a and 24b has reached approximately 1150° C., the number of revolutions of the Si wafer is gradually increased. Then, the source gas with the carrier gas is supplied from the reaction gas reservoir 29.

In the present embodiment, trichlorosilane can be used as a source gas. The source gas that is mixed with hydrogen gas as a carrier gas is introduced from the gas supply unit 5 into the chamber 1.

The reaction gas 4 passes through the through-holes 15a of the shower plate 15, and then flows into the space A in which the epitaxial growth reaction will be performed on the substrate 7. At this time, the flow of the reaction gas 4 is straightened by passing the gas through the shower plate 15 serving as a straightening vane so that the reaction gas 4 flows substantially vertical downward toward the substrate 7 placed under the shower plate 15.

The temperature of the Si wafer is maintained at 1150° C. degrees. The susceptor 8 is rotating at 900 rpm or more. The reaction gas 4 is continuously supplied to the Si wafer through the shower plate 15 from the gas supply unit 5.

In addition, an inert gas, such as Ar (argon), is supplied from the inert gas reservoir 28 to the gas inlet 25. The flow rate of the inert gas can be set at, for example, 5 L/min.

In the epitaxial growth apparatus 100, the upper end face of the reflecting ring 18 is higher in height than both the surface of the substrate 7 and the upper end face of the susceptor 8. Here, the difference between the height of the reflecting ring 18 and the heights of the surface of the substrate 7 and the upper end face of the susceptor 8 can be set, for example, in a range between 1 mm and 12 mm.

According to the above configuration, as described in the first embodiment, the region where the concentration of the reaction gas 4 is high can be positioned away from the susceptor 8 outside the substrate 7 (see FIG. 5). Therefore, the formation of the thin film on the surface of the susceptor 8 due to the reaction gas 4 can be suppressed.

As mentioned above, the Si epitaxial film having a uniform thinness can be grown on the Si wafer.

Next, the supply of the reaction gas 4 is stopped. Then, the output of the heater 9 is turned off. After the temperature of the Si wafer as measured by the radiation thermometer 24a and 24 becomes more than a predetermined temperature the Si wafer is transferred from the chamber 1.

As mentioned above, according to the present embodiment the formation of the thin film on the surface of the susceptor 8 due to the reaction gas 4 can be suppressed. Therefore, the frequency of etching for thin film removal can be reduced. For example, assuming that the etching process is performed every time a single epitaxial growth reaction is completed in the apparatus shown in FIG. 3 and explained with respect to the first embodiment, the frequency of the etching process can be reduced in the third embodiment such that the etching process is performed every time a predetermined number of times of epitaxial growth reactions is completed.

After a predetermined number of times of epitaxial growth reactions are successively performed, the etching process for removing the thin film formed on the surface of the susceptor 8 due to the reaction gas 4 is performed. However, the thin film does not necessarily have to be due to the reaction gas 4. In addition, the thin film means an excess film, which has been formed on the surface of the susceptor 8, including all films to be removed by the etching process.

Firstly, a dummy substrate 7, for example, a Si wafer is placed on the susceptor 8. This can prevent the etching gas from entering the rotary drum 17 to corrode the members constituting the epitaxial growth apparatus 100.

Next, as seen in FIG. 1, the etching gas is introduced into the chamber 1 by the etching gas reservoir 34 through the gas inlet 5. After the film-forming process of the Si (silicon) epitaxial film, an HCl (hydrogen chloride) gas is used as the etching gas in order to remove the Si epitaxial film formed on the susceptor 8.

An inert gas, such as Ar (argon) is supplied from the inert gas reservoir 28 to the gas supply unit 25. The flow rate of the inert gas can be set at a lower value than the value of the epitaxial growth process, for example, 1 L/min.

It is preferable that the susceptor 8 is rotated via the rotating shaft 17 while the heater 9 heats the susceptor, and while the chamber is supplied with etching gas, thereby efficiently removing the thin film on the susceptor 8.

The etching gas is attracted by the substrate 7 while the substrate 7 is rotating, and the etching forms a so-called vertical flow in a region extending from the shower plate 15 to the surface of the substrate 7. When the etching gas 4 reaches the substrate 7, the etching gas 4 flows without turbulence as a substantially laminar flow in a horizontal direction along the upper surface of the substrate 7. As described above, the etching gas 4 then comes into contact with the surface of the substrate 7. The thin film on the susceptor 8 is removed by etching process.

In the epitaxial growth apparatus 100, the upper end face of the reflecting ring 18 is higher in height than both the surface of the substrate 7 and the upper end face of the susceptor 8. Therefore, if the flow rate of the inert gas jetted out from the gas passageway 19 is the same as in the epitaxial growth process, the thickness of the boundary layer in the vicinity of the reflecting ring 18 becomes large. However, if the flow rate of the inert gas is made lower than that in the epitaxial growth process, the thickness of the boundary layer becomes small, and thus the concentration of the etching gas on the surface of the susceptor 8 is made high, so that the etching can be promoted efficiently.

An end point of the etching can be controlled, for example, on the basis of time. That is, the etching rate and the thickness of the thin film formed on the susceptor 8 after a predetermined number of times of epitaxial growth reactions is performed are known in advance. From this information, the time required for etching is determined, and thus the etching process can be terminated at the predetermined time.

After the etching process is terminated, the dummy substrate 7 is unloaded from the chamber 1. Then, in the same manner as described above, a new Si wafer is loaded into the chamber 1, and thereafter a new epitaxial growth process is performed.

According to the film-forming method of the third embodiment, the epitaxial growth reaction is performed with the upper end face of the reflecting ring 18 set to be higher in height than both the surface of the substrate 7 and the upper end face of the susceptor 8. Since this enables the concentration of the reaction gas 4 on the surface of the susceptor 8 to be reduced, the formation rate of the thin film due to the reaction gas 4 can be reduced. In addition, when the etching for removing this thin film is performed, the flow rate of the gas jetted out from the clearance between the susceptor 8 and the reflecting ring 18 is reduced. Since this enables the concentration of the etching gas on the susceptor surface to be increased, it becomes possible to proceed the etching efficiently.

Embodiment 4

The film-forming apparatus according to embodiment 2 can perform a film-forming method according to the present embodiment. Therefore, the film-forming method according to the present embodiment is described referring to epitaxial growth apparatus 200, as seen in FIG. 8 and FIG. 9.

The epitaxial growth apparatus 200 is preferable for performing a Si epitaxial film. The below mentioned is one example of Si epitaxial film-forming.

Firstly the substrate 7 is transferred into the chamber 1, and then is placed on the susceptor 8. For example, a SiC wafer or Si wafer can be used as the substrate 7, or the material of the substrate 7 may be, for example, $SiO_2$ (quartz) or another insulator. A highly resistive semi-insulating substrate such as GAas (gallium arsenide) can also be used.

Next, Si film is formed on the substrate 7.

For example, a Si wafer is used as the substrate 7, and is then placed on the susceptor 8.

At that time, epitaxial growth apparatus 200 is in the situation shown in FIG. 8. That is, the upper end face of the reflecting ring 18" is set to be higher in height than both the surface of the substrate 7 and the upper end face of the susceptor 8.

Then, H2 (hydrogen) gas as a carrier gas is flowed from the reaction gas reservoir 29 under ordinary pressure or an appropriately reduced pressure. At this time, the source gas is not supplied. During this process, that is, the carrier gas flowing from the reaction gas reservoir 29 under ordinary pressure or an appropriately reduced pressure, and the source gas not being supplied, the Si wafer is rotated with the susceptor 8 at about 50 rpm.

Then, the Si wafer is heated to a temperature within a range of 1100° C. to 1200° C. by the heater 9. After it is confirmed that the temperature of the Si wafer measured by the radiation thermometer 24a and 24b has reached approximately 1150° C., the number of revolutions of the Si wafer is gradually increased. Then, the source gas with the carrier gas is supplied from the reaction gas reservoir 29.

In the present embodiment, trichlorosilane can be used as a source gas. The source gas that is mixed with hydrogen gas as a carrier gas is introduced from the gas supply unit 5 into the chamber 1.

The reaction gas 4 passes via the through-holes 15a of the shower plate 15, and then flows into the space A in which the epitaxial growth reaction will be performed on the substrate 7. At this time, the flow of the reaction gas 4 is straightened by passing the gas through the shower plate 15 serving as a straightening vane so that the reaction gas 4 flows vertical downward toward the substrate 7 placed under the shower plate 15.

The temperature of the Si wafer is maintained at 1150° C. degrees. The susceptor 8 is rotating at 900 rpm or more. The reaction gas 4 is continuously supplied to the Si wafer through the shower plate 15 from the gas supply unit 5.

In addition, an inert gas, such as Ar (argon), is supplied from the inert gas reservoir 28 to the gas inlet 25. The flow rate of the inert gas can be set at, for example, 5 L/min.

In the epitaxial growth apparatus 100, the upper end face of the reflecting ring 18 is higher in height than both the surface of the substrate 7 and the upper end face of the susceptor 8. Here, the difference between the height of the reflecting ring 18 and the heights of the surface of the substrate 7 and the upper end face of the susceptor 8 can be set, for example, in a range between 1 mm and 12 mm.

According to the construction shown in FIG. 8, the upper end face of the reflective means 18" is set to be higher in height than both the surface of the substrate 7 and the upper end face of the susceptor 8. Therefore, as described in embodiment 1 the region where the concentration of reaction gas 4 is high, can be positioned away from the susceptor 8, outside the substrate 7 (see FIG. 5), as a result the formation of the thin film on the surface of the susceptor 8 due to the reaction gas 4 can be suppressed.

As mentioned above, the Si epitaxial film having a uniform thinness can be grown on the Si wafer.

Next, the supply of the reaction gas 4 is stopped. Then, the output of the heater 9 is turned off. After the temperature of the Si wafer as measured by the radiation thermometer 24a and 24 becomes more than a predetermined temperature the Si wafer is transferred from the chamber 1.

As mentioned above, according to the present embodiment the formation of the thin film on the surface of the susceptor 8 due to the reaction gas 4 can be suppressed. Therefore, the frequency of etching for thin film removal can be reduced. For example, as the apparatus described in FIG. 3 of embodiment 1, when the upper end face of the reflecting ring is set to be higher in height than both the surface of the substrate and the upper end face of the susceptor assuming the etching process is performed every time a single epitaxial growth reaction is completed, the frequency of the etching process can be reduced such that the etching process is performed every time a predetermined number of times of epitaxial growth reaction is completed.

After a predetermined number of times of epitaxial growth reactions are successively performed, the etching process for removing the thin film formed on the surface of the susceptor 8 due to the reaction gas 4 is performed. However, the thin film does not necessarily have to be due to the reaction gas 4, that is, it could be a film caused by another gas, as one example. In addition, the thin film can be known to mean an excess film, which has been formed on the surface of the susceptor 8, including all films to be removed by the etching process.

Firstly, a dummy substrate 7, for example, a Si wafer is placed on the susceptor 8. This can prevent the etching gas from entering the rotary drum 17 to corrode the members constituting the epitaxial growth apparatus 200.

When the rod 38 is lowered, the reflecting ring 18" is moved together with the rod 38. Thereby, the upper end face of the reflecting ring 18" is set to be lower in height than both the surface of the substrate 7 and the upper end face of the susceptor 8.

Next, through the gas inlet 5 in FIG. 9, the etching gas is introduced into the chamber 1 by the etching gas reservoir 34. After the film-forming process of the Si (silicon) epitaxial film, an HCl (hydrogen chloride) gas is used as the etching gas in order to remove the Si epitaxial film formed on the susceptor 8.

The inert gas, for example, argon is supplied from the inert gas something 28 to the supply portion 25. The flow rate of the inert gas can be same as the flow rate of the epitaxial growth process; also it can be a lower rate than the rate of the epitaxial growth process. However, if the flow rate is too low, the etching gas easily enters to the gas passageway 19.

It is preferable that the susceptor 8 will be rotated via the rotating shaft 17 while the heater 9 heats the susceptor, and an etching gas is supplied to the chamber, thereby efficiently removing the thin film on the susceptor 8.

The etching gas is attracted by the substrate 7 while the substrate 7 is rotating, and the etching forms a so-called vertical flow in a region extending from the shower plate 15 to the surface of the substrate 7. When the etching gas 4 reaches the substrate 7, the etching gas 4 flows without turbulence as a substantially laminar flow in a horizontal direction along the upper surface of the substrate 7. As described above, the etching gas 4 then comes into contact with the surface of the substrate 7. The thin film on the susceptor 8 is removed by etching process.

As the upper end face of the reflecting ring 18" is lower in height than both the surface of the substrate 7 and the upper end face of the susceptor 8, the thickness of the boundary layer close to the reflecting ring 18" becomes small. If the flow rate of the inert gas jetted out from the gas passageway 19 is lower than the epitaxial growth process, the thickness of boundary layer becomes small. When the thickness of the boundary layer becomes small the concentration of the etching gas on the surface of the susceptor 8 is made high, thereby the etching process can be efficiently performed.

An end point of the etching can be controlled, for example, on the basis of time. That is, the etching rate and the thickness of the thin film formed on the susceptor 8 after a predetermined number of times of epitaxial growth reactions is performed are known in advance. From this information, the time required for etching is determined, and thus the etching process can be terminated at the determined time.

After the etching process is completed, the raising and lowering mechanism 37 is controlled so as to raise the rod 38. Then, the reflecting ring 18" ascends via the rod 38. This brings the epitaxial growth apparatus 200 back to a state in FIG. 8, so that the configuration suitable for the epitaxial growth process can be restored.

Next, the dummy substrate 7 is unloaded from the chamber 1. In the same manner as described above, a new Si wafer is loaded into the chamber 1, and thereafter a new epitaxial growth process is performed.

According to the film-forming method of the third embodiment, the epitaxial growth reaction is performed with the upper end face of the reflecting ring 18 set to be higher in height than both the surface of the substrate 7 and the upper end face of the susceptor 8. Since this enables the concentration of the reaction gas 4 on the surface of the susceptor 8 to be reduced, the formation rate of the thin film due to the reaction gas 4 can be reduced. On the other hand, when the etching for removing this thin film is performed, the upper end face of the reflecting ring 18" is made lower in height than both the surface of the substrate 7 and the upper end face of the susceptor 8 by the raising and lowering mechanism 37 and the rod 38. The concentration of the etching gas on the surface of the susceptor 8 is then high; therefore the etching can be performed efficiently.

The present invention is not limited to the embodiments described and can be implemented in various ways without departing from the spirit of the invention.

For example, in the first embodiment, the epitaxial growth process and the etching process have been performed in the same chamber 1, but the present invention is not limited to this. The epitaxial growth apparatus of the first embodiment may have an etching chamber in addition to the chamber 1. In this case, the epitaxial growth process is performed in the chamber 1, and the etching process is performed in the etching chamber. Such a configuration also enables the concentration of the reaction gas 4 on the surface of the susceptor 8 to be reduced in the chamber 1, and accordingly the formation rate of the thin film due to the reaction gas 4 can be reduced. In addition, having the etching chamber provides the advantageous effect of enabling the epitaxial growth process and the etching process to be performed simultaneously.

In addition, in the second and fourth embodiments, an example of the epitaxial growth apparatus provided with the mechanism for raising and lowering the reflecting ring has been adopted, but the present invention is not limited to this example. It is only necessary to satisfy the relationships according to the present invention between the height of the reflecting ring and the respective heights of the substrate and the susceptor according to whether the epitaxial film-forming process is being performed or the etching process is being performed. Therefore, the epitaxial growth apparatus may be provided with a mechanism for raising and lowering the susceptor and the substrate, for example, the mechanism for raising and lowering the rotary drum, instead of the mechanism for raising and lowering the reflecting ring.

In addition, in the first to fourth embodiments, the epitaxial growth apparatuses have been taken as the examples to describe the formation of the Si epitaxial film, but the present invention is not limited to these examples. As long as a film is formed on the surface of a substrate placed on a chamber by supplying a reaction gas into the chamber, the present invention can be applied to any other vapor deposition apparatuses or other film-forming apparatuses. In addition, the film-forming apparatus of the present invention can also be used for formation of other epitaxial films, such as a GaN film, an AlGaN film, or an AlN film, other vapor deposition films, or the like.

The above description of the invention has not specified apparatus constructions, control methods, etc. which are not essential to the description of the invention, since any suitable apparatus constructions, control methods, etc; can be employed to implement the invention.

Further, the scope of this invention encompasses all vapor phase growth apparatus employing these elements and variations thereof, which can be designed by those skilled in the art.

What is claimed is:

1. A film-forming apparatus comprising:
a chamber;
a substrate-supporting portion configured to support a substrate placed in the chamber;
a first gas supply unit configured to supply a reaction gas for a film-forming process to the chamber, in which the reaction gas flow is from an upper side of the substrate supported by the substrate-supporting portion to the substrate;
a heating unit configured to heat the substrate from below the substrate-supporting portion;
a rotary drum configured to support the substrate-supporting portion on a top thereof, and including the heating unit disposed therein;
a rotary shaft disposed in a lower part of the chamber, and configured to rotate the rotary drum; and
a reflector disposed so as to surround the rotary drum and configured to reflect heat from the heating unit, wherein
the reflector is disposed so as to have a straight upper end at a position 1 mm to 12 mm higher in height than a top surface of the substrate so that the reaction gas rises once at the periphery of the substrate-supporting portion and passes over the upper end of the reflector such that a formed boundary layer above the substrate-supporting portion is thicker than the formed boundary layer above the substrate.

2. The film-forming apparatus according to claim 1, further comprising:
a second gas supply unit configured to supply a hydrogen gas or an inert gas from a bottom of a clearance between the rotary drum and the reflector to a top of the clearance.

3. The film-forming apparatus according to claim 2, further comprising:
a third gas supply unit configured to supply an etching gas to the chamber; and
a control unit configured to control the flow rate of the gas from the second gas supply unit when the etching gas is supplied from the third gas supply unit to the chamber lower than the flow rate thereof when the reaction gas is supplied from the first gas supply unit to the chamber.

4. The film-forming apparatus according to claim 1, wherein the difference in height between the upper end of the substrate-supporting portion and the upper end of the reflector falls in a range from a value equal to the thickness of the boundary layer to a value of twice the thickness of the boundary layer, wherein the boundary layer is formed in the vicinity of the surface of the substrate-supporting portion and is a region where the concentration of the reaction gas varies.

5. The film-forming apparatus according to claim 1, wherein the heating unit comprises a first heater heating the substrate and a second heater heating an outer peripheral portion of the substrate.

6. A film-forming apparatus comprising:
a chamber;
a substrate-supporting portion configured to support a substrate placed in the chamber;
a first gas supply unit configured to supply a reaction gas for a film-forming process to the chamber, in which the reaction gas flow is from an upper side of the substrate supported by the substrate-supporting portion to the substrate;
a heating unit configured to heat the substrate from below the substrate-supporting portion;
a rotary drum configured to support the substrate-supporting portion on a top thereof, and including the heating unit disposed therein;
a rotary shaft disposed in a lower part of the chamber, and rotating the rotary drum;
a reflector disposed so as to surround the rotary drum and configured to reflect heat from the heating unit; and
a raising and lowering unit configured to raise and lower at least one of the rotary drum and the reflector, wherein
the raising and lowering unit relatively raises the reflector so as to have a straight upper end position at a position 1 mm to 12 mm higher in height than a top surface of the substrate so that the reaction gas rises once at a periphery of the substrate-supporting portion and passes over the upper end of the reflector such that a formed boundary layer above the substrate-supporting portion is thicker than the formed boundary layer above the substrate.

7. The film-forming apparatus according to claim 6, comprising:
   a second gas supply unit configured to supply a hydrogen gas or an inert gas from a bottom of a clearance between the rotary drum and the reflector to a top of the clearance.

8. The film-forming apparatus according to claim 7, wherein the raising and lowering unit performs a control to make an upper end of the reflector lower in height than an upper end of the substrate-supporting portion when the etching gas is supplied from the third gas supply unit.

9. The film-forming apparatus according to claim 7, further comprising:
   a third gas supply unit configured to supply an etching gas to the chamber; and
   a control unit configured to control the flow rate of the gas from the second gas supply unit according to whether the reaction gas is supplied from the first gas supply unit to the chamber or the etching gas is supplied from the third gas supply unit to the chamber.

10. The film-forming apparatus according to claim 8, wherein the difference in height between the upper end of the substrate-supporting portion and the upper end of the reflector falls in a range from a value equal to the thickness of the boundary layer to a value of twice the thickness of the boundary layer, wherein the boundary layer is formed in the vicinity of the surface of the substrate-supporting portion and is a region where the concentration of the reaction gas varies.

11. The film-forming apparatus according to claim 6, wherein the heating unit comprises a first heater heating the substrate and a second heater heating an outer peripheral portion of the substrate.

\* \* \* \* \*